US009306497B2

(12) United States Patent
Scott et al.

(10) Patent No.: US 9,306,497 B2
(45) Date of Patent: Apr. 5, 2016

(54) SYNTHESIZER METHOD UTILIZING VARIABLE FREQUENCY COMB LINES AND FREQUENCY TOGGLING

(71) Applicant: Associated Universities, Inc., Washington, DC (US)

(72) Inventors: Richard D. Scott, Socorro, NM (US); Walter F. Brisken, St. Paul, MN (US); Robert E. Long, Castle Rock, CO (US)

(73) Assignee: Associated Universities, Inc., Washington, DC (US)

( * ) Notice: Subject to any disclaimer, the term of this patent is extended or adjusted under 35 U.S.C. 154(b) by 94 days.

(21) Appl. No.: 14/323,278

(22) Filed: Jul. 3, 2014

(65) Prior Publication Data

US 2014/0361811 A1    Dec. 11, 2014

Related U.S. Application Data

(63) Continuation of application No. 13/947,515, filed on Jul. 22, 2013, now Pat. No. 8,779,814.

(60) Provisional application No. 61/674,445, filed on Jul. 23, 2012.

(51) Int. Cl.
*H03L 7/06* (2006.01)
*H03B 21/02* (2006.01)
*H03L 7/16* (2006.01)

(52) U.S. Cl.
CPC .......... *H03B 21/025* (2013.01); *H03L 7/16* (2013.01); *H03B 2200/0054* (2013.01); *H03L 2207/12* (2013.01)

(58) Field of Classification Search
USPC .................................. 327/147–149, 156–158
See application file for complete search history.

(56) References Cited

U.S. PATENT DOCUMENTS

| 5,428,361 | A | * | 6/1995 | Hightower | G01S 7/282 |
| | | | | | 331/107 A |
| 5,451,910 | A | * | 9/1995 | Guthrie | H03L 7/16 |
| | | | | | 327/105 |
| 5,508,661 | A | | 4/1996 | Keane et al. | |
| 6,509,800 | B2 | * | 1/2003 | Stockton | H03L 7/1976 |
| | | | | | 327/115 |
| 6,747,987 | B1 | * | 6/2004 | Meador | H03C 3/0933 |
| | | | | | 370/465 |
| 7,701,997 | B2 | * | 4/2010 | Tal | H03C 3/40 |
| | | | | | 375/132 |
| 8,704,562 | B2 | * | 4/2014 | Nicholls | H03L 7/00 |
| | | | | | 327/144 |
| 2002/0006171 | A1 | | 1/2002 | Nielsen | |

(Continued)

OTHER PUBLICATIONS

PCT Search Report for PCT/US2013/51473, dated Dec. 9, 2013.

(Continued)

*Primary Examiner* — Adam Houston
(74) *Attorney, Agent, or Firm* — Remenick PLLC

(57) ABSTRACT

A variable frequency synthesizer and method of outputting the variable frequency is disclosed. The synthesizer comprises a first reference frequency, a direct digital synthesizer (DDS) receiving the first reference frequency and outputting a tuned frequency, a variable frequency comb generator receiving the tuned frequency and outputting a variable frequency comb comprised of a plurality of comb lines, a mixer receiving the variable frequency comb and a signal from an oscillator and outputting an intermediate frequency, a phase lock loop (PLL) receiving a second reference frequency and the intermediate frequency and outputting a phase lock signal, and the oscillator receiving the phase lock signal and outputting a variable synthesized frequency.

32 Claims, 8 Drawing Sheets

(56) References Cited

U.S. PATENT DOCUMENTS

| | | |
|---|---|---|
| 2007/0040615 A1 | 2/2007 | Ammar |
| 2008/0252384 A1 | 10/2008 | Chow et al. |
| 2010/0020730 A1* | 1/2010 | Man .................. H03L 7/23 370/277 |
| 2011/0095830 A1* | 4/2011 | Tsangaropoulos ..... G06F 1/025 331/34 |
| 2012/0294343 A1* | 11/2012 | Teetzel ................ H04B 1/0475 375/224 |
| 2013/0069699 A1* | 3/2013 | Szilagyi .................. H03L 7/08 327/156 |
| 2013/0308663 A1* | 11/2013 | Chen .................. H01S 5/06256 372/20 |
| 2014/0015572 A1* | 1/2014 | Nicholls .................. H03L 7/00 327/117 |
| 2014/0021986 A1* | 1/2014 | Scott ........................ H03L 7/16 327/156 |

OTHER PUBLICATIONS

PCT Patentability Report for PCT/US2013/51473, dated Dec. 9, 2013.

* cited by examiner

SYNTHESIZER METHOD UTILIZING VARIABLE FREQUENCY COMB LINES AND FREQUENCY TOGGLING

REFERENCE TO RELATED APPLICATIONS

This application claims priority to U.S. application Ser. No. 13/947,515, filed Jul. 22, 2013, entitled "Synthesizer Method Utilizing Variable Frequency Comb Lines and Frequency Toggling," which claims priority to U.S. Provisional Application No. 61/674,445, filed Jul. 23, 2012, entitled "Synthesizer Method Utilizing Variable Frequency Comb Lines and Frequency Dithering." Both are hereby specifically and entirely incorporated by reference.

RIGHTS IN THE INVENTION

This invention was made with government support under Cooperative Agreement AST-0223851, between the National Science Foundation and Associated Universities, Inc., and, accordingly, the United States government has certain rights in this invention.

BACKGROUND

1. Field of the Invention

The invention is directed to a synthesizer. Specifically, the invention is directed to a synthesizer utilizing variable frequency comb lines and toggling.

2. Background of the Invention

Vadim Manassewitcsh in *Frequency Synthesis Theory and Design* (3$^{rd}$ Edition, John Wiley and Sons 1987) starts Chapter 1 "A frequency synthesis is a combination of system elements that results in the generation of one or many frequencies from one or a few reference sources." Manassewitch then goes on to explain the different types of synthesizer: coherent or incoherent; direct or indirect.

The signal source for a synthesizer can be an oscillator capable of tuning directly to approximately the desired frequency. However, most oscillators are incoherent until they are phase locked using a Phase Lock Loop (PLL) to some reference frequency. There is a large frequency difference between the desired frequency and the reference frequencies that needs to be addressed.

Some existing synthesizer designs solve this frequency difference problem using a reference signal (or, one of the reference signals) to drive a comb generator. In simple terms, the output frequencies of a comb generator are all harmonically related to the input frequency. Typically, a frequency comb spans the entire frequency band required of the synthesizer and has evenly spaced (in frequency) teeth. The teeth can be used like a ruler to measure other frequency sources with high precision.

Existing frequency synthesizers rely on fixed inputs or in some cases either a couple of harmonics or sub-harmonics of the input frequency to drive the comb generator or generators. By allowing the input frequency to vary (near) continuously over a frequency range, the ruler can be controllably stretched or compressed. These stretchable comb lines can then be compared to the oscillator output frequency by using a frequency mixer. The mixer finds the sum or the difference between the oscillator frequency and all the comb lines.

Existing synthesizers utilizing fixed (or near fixed) comb lines can use a Fine Tune Synthesizer (FTS) to tune to a small range of offset frequencies around the fixed comb lines. However, this results in tuning holes in the output frequency range due to limitations in the FTS tuning and frequency range limitations of the PLL itself. An additional disadvantage is the existence of close spurs due to mixer non-linearities and adjacent comb lines at specific Direct Digital Synthesizer (DDS) frequency settings. These spurs can result in undesirable sinusoidal phase variation over time or other degradations of the desired signal quality (spectral purity).

SUMMARY OF THE INVENTION

The present invention overcomes the problems and disadvantages associated with current strategies and designs and provides new tools and methods of creating variable comb line synthesizers.

One embodiment is directed a variable frequency synthesizer. The synthesizer comprises a clock outputting a fixed reference frequency, a direct digital synthesizer (DDS) receiving the fixed reference frequency and outputting a tuned frequency, a variable frequency comb generator receiving the tuned frequency and outputting a variable frequency comb comprised of a plurality of comb lines, a mixer receiving the variable frequency comb and a signal from an oscillator and outputting a fixed intermediate frequency, and a phase lock loop (PLL) receiving the fixed reference frequency and the fixed intermediate frequency and outputting a phase lock signal, the oscillator receiving the phase lock signal and outputting a range of synthesized frequencies.

Preferably, the fixed intermediate frequency is the difference between the output of the oscillator and at least one comb line. In a preferred embodiment, the oscillator is a YIG type oscillator. Preferably, an error correction signal from the PLL is a current. In a preferred embodiment, the oscillator is a voltage controlled oscillator (VCO). Preferably, the error correction signal from the PLL is a voltage.

Preferably, the synthesizer further comprises a second fixed reference frequency, wherein one of the DDS and the PLL receives the second fixed reference frequency. Preferably, there are no tuning holes in the outputted variable synthesized frequency. In the preferred embodiment, the DDS is tunable over a range of about ⅙ of the fixed reference frequency to about ⅖ of the fixed reference frequency. Preferably, the DDS output frequency is within the first Nyquist zone. Preferably, the DDS output frequency is in a Nyquist zone higher than the first Nyquist zone.

In the preferred embodiment, the relationship between the lowest outputted synthesized frequency ($F_{MIN}$), the maximum DDS tuning range ($\Delta DDS_{MAX}$), and the comb line spacing is governed by:

$$F_{MIN} \times \Delta DDS_{MAX} \geq (\text{comb spacing})^2.$$

Preferably, the polarity of the PLL can be switched between positive and negative. Preferably, the frequency comb lines cover a range of 2 to 20 GHz.

In the preferred embodiment, the DDS is toggled to tune the synthesizer to a desired frequency not otherwise attainable by the DDS absent toggling. Preferably, the specific frequency is attained by switching between a first frequency attainable by the DDS without toggling and a second frequency attainable by the DDS without toggling, wherein the first frequency and the second frequency surround the desired frequency. The DDS is preferably held at a first tuning word for a first sequence length and subsequently held at a second tuning word for a second sequence length.

Preferably, the first tuning word and the second tuning word differ by one and the total time of the first sequence length and the second sequence length is minimized. Preferably, first tuning word is determined by $$a_1 = \left\lfloor \frac{2^b v}{f} \right\rfloor;$$

the second tuning word is determined by $$a_2 = \left\lceil \frac{2^b v}{f} \right\rceil;$$

the first sequence length is determined by $$k_1 = \frac{mf}{g} a_2 - \frac{2^b n \Delta}{g};$$

and
the second sequence length is determined by $$k_2 = \frac{2^b n \Delta}{g} - \frac{mf}{g} a_1;$$

wherein, f is the clock frequency, b is the phase register length, v is a quantized frequency, m and n are integers, $\Delta$ is the synthesizer tuning step size, and g=gcd(mf, $2^b n\Delta$), wherein gcd is the greatest common divisor.

Preferably, the DDS is varies between a first tuning word and a second tuning word for a first sequence length and subsequently the DDS is held at a second tuning word for a second sequence length.

Another embodiment of the invention is directed to a method of outputting a variable frequency. The method comprises the steps of outputting a fixed reference frequency at a clock, receiving the fixed reference frequency at a direct digital synthesizer (DDS), outputting a tuned frequency from the DDS, receiving the tuned frequency at a variable frequency comb generator, outputting a variable frequency comb comprised of a plurality of comb lines from the variable frequency comb generator, receiving the variable frequency comb and a signal from an oscillator at a mixer, outputting a fixed intermediate frequency from the mixer, receiving the fixed reference frequency and the fixed intermediate frequency at a phase lock loop (PLL), outputting a phase lock signal from the PLL, receiving the phase lock signal at the oscillator, and outputting a range of synthesized frequencies.

Preferably, the fixed intermediate frequency is the difference between the output of the oscillator and at least one comb line. Preferably, the oscillator is a YIG type oscillator. Preferably, an error correction signal from the PLL is a current. In a preferred embodiment, the oscillator is a voltage controlled oscillator (VCO). Preferably, the error correction signal from the PLL is a voltage.

In a preferred embodiment, one of the DDS and the PLL receives a second fixed reference frequency. Preferably, there are no tuning holes in the outputted variable synthesized frequency. Preferably, the DDS is tunable over a range of about ⅙ of the fixed reference frequency to about ⅔ of the fixed reference frequency. Preferably, the DDS output frequency is within the first Nyquist zone. Preferably, the DDS output frequency is in a Nyquist zone higher than the first Nyquist zone.

Preferably, the relationship between the lowest outputted synthesized frequency ($F_{MIN}$), the maximum DDS tuning range ($\Delta DDS_{MAX}$), and the comb line spacing is governed by:

$$F_{MIN} \times \Delta DDS_{MAX} \geq (\text{comb spacing})^2.$$

In a preferred embodiment, the polarity of the PLL can be switched between positive and negative. Preferably, the frequency comb lines cover a range of 2 to 18 GHz.

Preferably the DDS is dithered to tune the synthesizer to a desired frequency not otherwise attainable by the DDS absent toggling. In a preferred embodiment, the specific frequency is attained by tuning between a first frequency attainable by the DDS without toggling and a second frequency attainable by the DDS without toggling, wherein the first frequency and the second frequency surround the desired frequency. Preferably, the DDS is held at a first tuning word for a first sequence length and subsequently held at a second tuning word for a second sequence length. Preferably, the first tuning word and the second tuning word differ by one and the total time of the first sequence length and the second sequence length is minimized.

In a preferred embodiment, the first tuning word is determined by $$a_1 = \left\lfloor \frac{2^b v}{f} \right\rfloor;$$

the second tuning word is determined by $$a_2 = \left\lceil \frac{2^b v}{f} \right\rceil;$$

the first sequence length is determined by $$k_1 = \frac{mf}{g} a_2 - \frac{2^b n \Delta}{g};$$

and
the second sequence length is determined by $$k_2 = \frac{2^b n \Delta}{g} - \frac{mf}{g} a_1;$$

wherein, f is the clock frequency, b is the phase register length, v is a quantized frequency, m and n are integers, $\Delta$ is the synthesizer tuning step size, and g=gcd(mf, $2^b n\Delta$), wherein gcd is the greatest common divisor.

In a preferred embodiment, the DDS is varies between a first tuning word and a second tuning word for a first sequence length and subsequently the DDS is held at a second tuning word for a second sequence length.

Another embodiment of the invention is directed to a method of tuning a direct digital synthesizer (DDS) to a desired frequency not otherwise attainable by the DDS. The method comprises the steps of tuning to a first frequency attainable by the DDS without toggling, and tuning to a second frequency attainable by the DDS without toggling, wherein the first frequency and the second frequency surround the desired frequency.

In a preferred embodiment the DDS is held at a first tuning word for a first sequence length and subsequently held at a second tuning word for a second sequence length. Preferably, the first tuning word and the second tuning word differ by one and the total time of the first sequence length and the second sequence length is minimized. Preferably, the first tuning word is determined by $$a_1 = \left\lfloor \frac{2^b v}{f} \right\rfloor;$$

the second tuning word is determined by $$a_2 = \left\lceil \frac{2^b v}{f} \right\rceil;$$

the first sequence length is determined by $$k_1 = \frac{mf}{g} a_2 - \frac{2^b n \Delta}{g};$$

and
the second sequence length is determined by $$k_2 = \frac{2^b n \Delta}{g} - \frac{mf}{g} a_1;$$

wherein, f is the clock frequency, b is the phase register length, v is a quantized frequency, m and n are integers, $\Delta$ is the synthesizer tuning step size, and $g=\gcd(mf, 2^b n \Delta)$, wherein gcd is the greatest common divisor.

In a preferred embodiment, the DDS is varies between a first tuning word and a second tuning word for a first sequence length and subsequently the DDS is held at a second tuning word for a second sequence length.

Other embodiments and advantages of the invention are set forth in part in the description, which follows, and in part, may be obvious from this description, or may be learned from the practice of the invention.

DESCRIPTION OF THE DRAWING

The invention is described in greater detail by way of example only and with reference to the attached drawing, in which.

DESCRIPTION OF THE INVENTION

As embodied and broadly described herein, the disclosures herein provide detailed embodiments of the invention. However, the disclosed embodiments are merely exemplary of the invention that may be embodied in various and alternative forms. Therefore, there is no intent that specific structural and functional details should be limiting, but rather the intention is that they provide a basis for the claims and as a representative basis for teaching one skilled in the art to variously employ the present invention A problem in the art capable of being solved by the embodiments of the present invention is overcoming frequency holes within the tuning range of a synthesizer. It has been surprisingly discovered that a variable frequency DDS driving a comb generator provides variable frequency comb lines that can be swept through the frequency holes. Furthermore, a fixed intermediate frequency (IF) can be chosen to be the clock or other reference frequency. The clock can also be used as the reference signal to the phase locked loop (PLL). Additionally, the DDS frequency can be toggled to produce integer frequency multiples at the output of the synthesizer, often called the step size of the synthesizer.

The new type of synthesizer described here can be described in those terms as coherent (definition: Of, relating to, or having waves with similar direction, amplitude, and phase that are capable of exhibiting interference) and a direct/indirect type hybrid. The direct portion consists of a Fine Tune Synthesizer (FTS) realized in the form of a Direct Digital Synthesizer (DDS) that allows precise digital control of the frequency and phase of the synthesized frequency. The indirect portion includes other elements including a Phase Lock Loop (PLL) which allows the synthesized frequency to maintain coherence in conjunction with the FTS. The difference between the frequency and a reference frequency (either the same or a different reference) are compared in the PLL. An error signal is generated and used to tune the oscillator to correct for the error. And thus, the loop is locked and is now coherent to the references.

Figure 1:
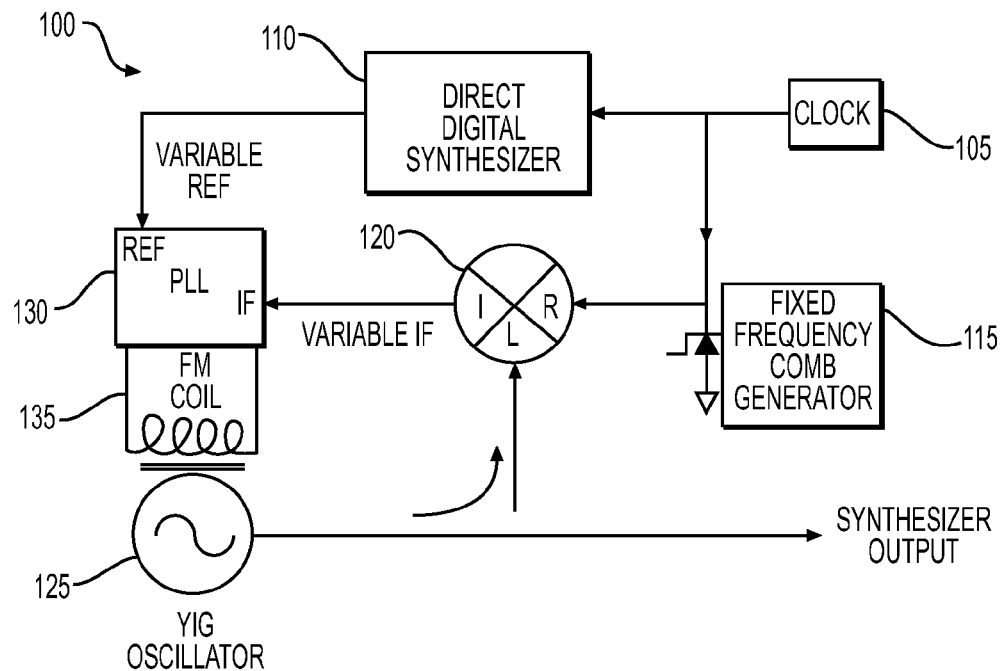
FIG. 1 depicts a prior art synthesizer.

FIG. 1 depicts a prior art microwave synthesizer schematic. Synthesizers similar to the synthesizer of FIG. 1 operate with some shortcoming. For example, such synthesizers are capable of tuning only to a small subset (approximately 36%) of the frequency range. This limit is caused by the DDS and the PLL. The DDS tuning range is limited due to digital synthesis techniques which generate spurious signals (e.g. harmonics) and aliases (which limit the high frequency tuning range to less than 40% of the clock frequency). If harmonics of the DDS are a concern the tuning range is further limited to less than one octave (otherwise, harmonics of the lower frequencies lie within the passband of any filter used to remove the clock, aliased signals, etc.). A transformer at the output of the DDS further limits the output frequency on the low frequency side to a few hundred kHz.

Synthesizers similar to the prior art synthesizer of FIG. 1 usually are designed to operate a few GHz range. Typically clock 105 is set to a fixed frequency (e.g. 125 MHz). The fixed frequency of the clock is used to tune the DDS 110 and fix the frequency of the comb generator 115. A DDS is a frequency synthesizer used to create waveforms from a reference clock. In the example depicted in FIG. 1, the DDS outputs a variable reference frequency (REF), for example at 40 MHz. The frequency comb generator 115 is set to a frequency that is the difference between the clock 105 frequency and the comb lines. The signal from fixed frequency comb generator 115 along with a signal from YIG Oscillator 125 enters mixer 120. Mixer 120 outputs a variable IF.

Phase Lock Loop (PLL) 130, coupled to frequency modulation (FM) coil 135, receives the variable REF from DDS 110 and the variable IF from mixer 140. PLL 130 outputs a signal to phase lock YIG oscillator 125. A YIG oscillator is a direct signal source that can provide multi octive tuning bandwidths in excess of 10 GHz. Phase locking a YIG oscillator reduces phase noise and increases the accuracy of the output frequency. The output of YIG oscillator 125 is typically between 8 and 14 GHz (approximately 8.04 GHz using example the numbers provided herein). The output signal from YIG oscillator 125 is input into mixer 120 via a directional coupler and is the output of the synthesizer 100.

Figure 2:
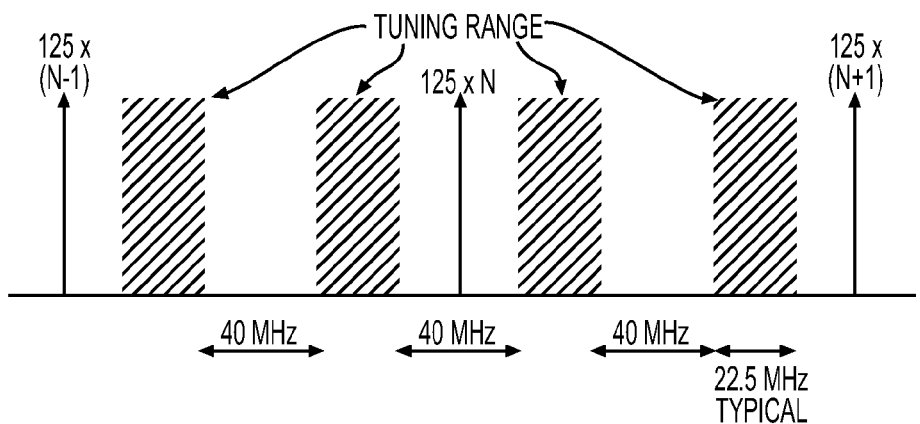
FIG. 2 depicts a schematic showing the holes in the tuning range of the prior art synthesizer.

The PLL of synthesizer 100 is limited by low frequency constraints (PLLs do not work at zero frequency) and direct current (DC) blocking capacitors between gain stages within the PLLs IF path. FIG. 2 depicts a schematic representation of the tuning range of synthesizer 100. The DDS of synthesizer 100 has a tuning range of 20 to 42.5 MHz. Synthesizer 100 can lock to this range offset from the 125 MHz (clock 105) comb lines over the 8-14 GHz range. The maximum continuous tuning range of synthesizer 100 is 25 MHz with 40 MHz holes (64≤N≤112). The shortcoming of synthesizer 100 is, close-in to the desired signal, spurious signals can exist when the DDS frequency is at particular rational fraction of the clock frequency (e.g. ⅓, ¼, ⅕, 2/7, ⅙, ⅖, and 3/10).

Figure 3:
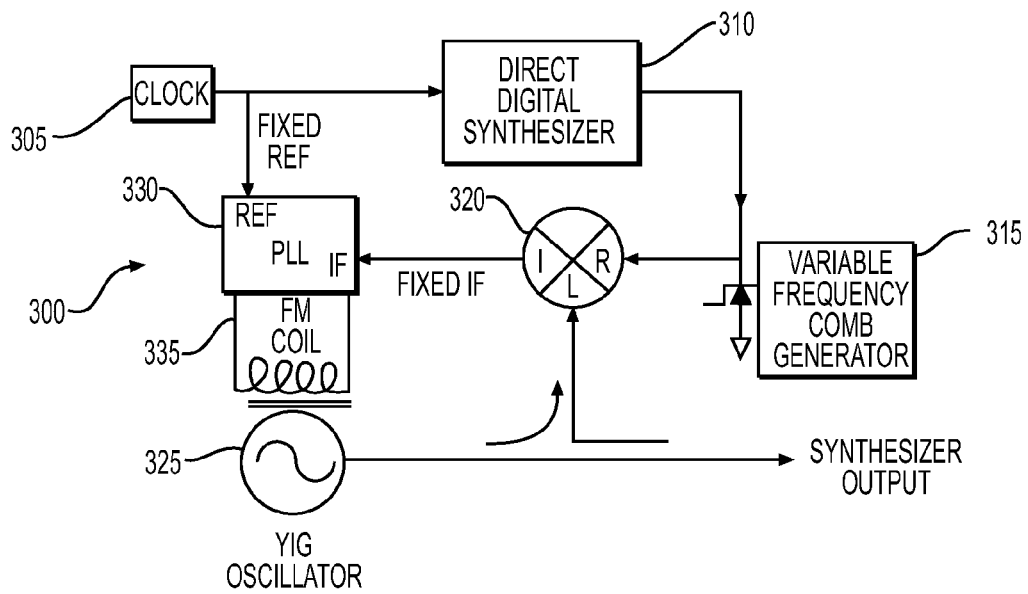
FIG. 3 depicts an embodiment of a synthesizer of the instant invention.

FIG. 3 depicts an embodiment of a synthesizer 300 of the instant invention. In synthesizer 300, clock 305 is fixed to output a fixed REF (e.g. 500 MHz). However, in other embodiments, clock 305 can output a variable REF. Preferably, the REF is set to the difference between the output of the YIG oscillator 325 and a comb line. The REF is output to both DDS 310 and PLL 330. The output signal from DDS 330 is received by variable frequency comb generator 315. The variable frequency comb output by variable frequency comb generator 315 is received by mixer 320, and is combined with a signal from YIG oscillator 325. Mixer 320 outputs an IF that is received by PLL 330. The IF can be fixed or variable. PLL 330, coupled to FM coil 335, creates a signal that phase locks YIG oscillator 325. The output signal from YIG oscillator 325 is input into mixer 320 via a directional coupler and is the output of the synthesizer 300. While a YIG oscillator is shown, another oscillator can be implemented, for example a voltage controlled oscillator (VCO). In the instance of a YIG oscillator, the error correction signal from the PLL is a current and in the case of a VCO oscillator, the error correction signal from the PLL is a voltage. If two reference frequencies are available, clock 305 and PLL 330 may have different references. A second DDS could be used to derive the PLL Reference frequency from the synthesizer reference frequency.

Figure 4:
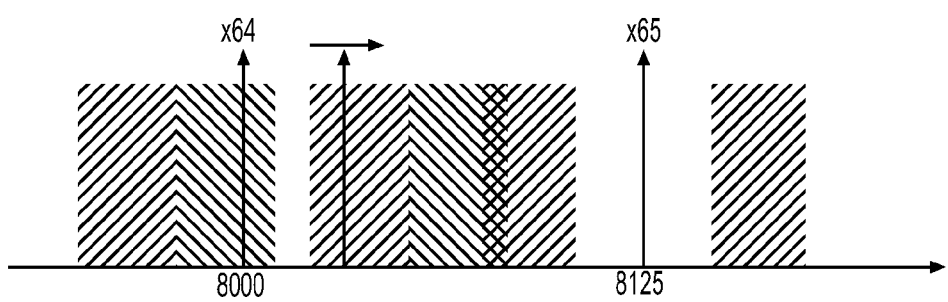
FIG. 4 depicts a schematic of the tuning holes being filled by the synthesizer of the instant invention.

The variability of the variable frequency comb generator 315 cause the tuning holes to disappear. FIG. 4 shows a pictorial representation of the holes disappearing. For example, as the x64 comb line is moved in a continuous fashion to the x65 comb line, all of the tuning holes between the x64 and x65 comb lines are filled. The comb line at x64 has to tune only about 2 MHz (125 MHz/64) in frequency. At the high end of the band, the x111 comb is tuned to x112 and the tuning range is about 1 MHz (125 MHz/112). Tuning the comb line implies the comb generator 315 is driven by DDS 310 (which provides the tuning). If the comb line is tuned, then the IF can become fixed at an arbitrary frequency (which can be conveniently chosen to be the same as the clock frequency or another reference frequency). The reference of the PLL 330 is preferably not the same clock 305 that clocks the DDS 310, as shown in FIG. 3 for improved spurious response.

Due to the DDS harmonics, aliases, and clock bleed-through, it is safe to tune DDS 310 over a range of about ⅙ of the clock (16.67%) to about ⅖ (40%) of the clock (i.e. a tuning range of about 23.33% of the clock frequency). DDS 310 nominally tuned close to ⅓ or ⅔ of the clock frequency provides for the simplest filter requirements. The simple filters can be maintained if the frequencies of the DDS are chosen to be multiples of the clock frequency (e.g. 1+k/3).

A relationship between the lowest frequency desired out of synthesizer 300, the maximum allowable DDS tuning range and the nominal frequency driving the comb generator (i.e. the comb line spacing) is:

$$F_{MIN} \times \Delta DDS_{MAX} \geq (\text{comb spacing})^2$$

Figure 5:
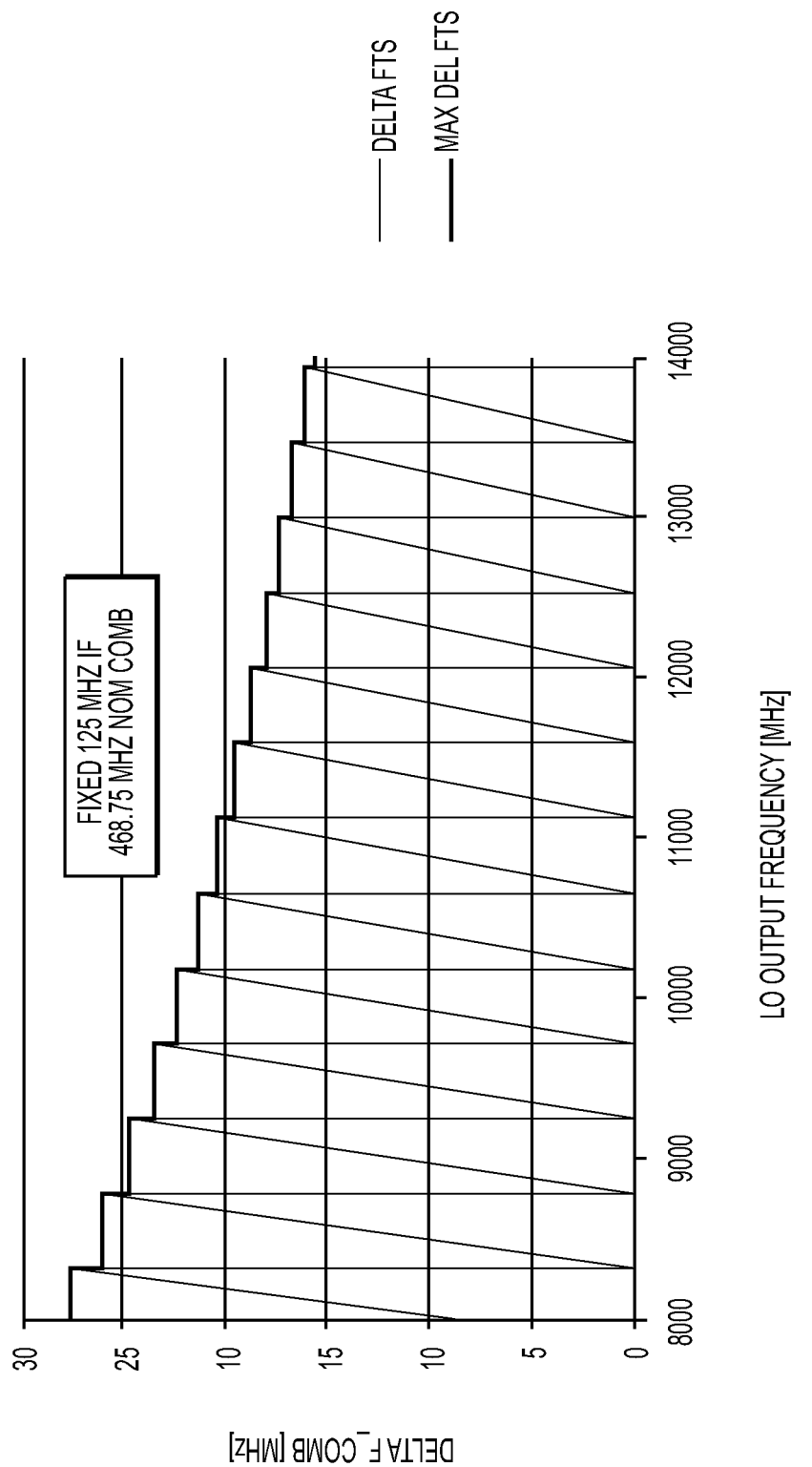
FIG. 5 depicts a tuning plan using the synthesizer of the instant invention.

Using the above equation, for example, for a minimum synthesizer frequency of 8 GHz and a maximum DDS tuning range of 27.6 MHz (i.e. about 22% of the 125 MHz clock frequency), the nominal comb spacing is 468.75 MHz. FIG. 5 depicts details of such tuning. As shown in FIG. 4, the synthesizer utilizes 15 variable frequency comb lines to cover the 8-14 GHz band as opposed to the original 48 comb lines of the original 125 MHz for the fixed comb lines. The nominal comb lines correspond to ΔDDS=0 of the tuning lines. In FIG. 4, the Max Del FTS is the limits of the DDS. For example, with an $F_{MAX}$ of 2000 MHz and a clock of 500 MHz, the synthesizer can tune over approximately 116⅔ MHz ($\Delta DDS_{MAX}$).

Figure 6:
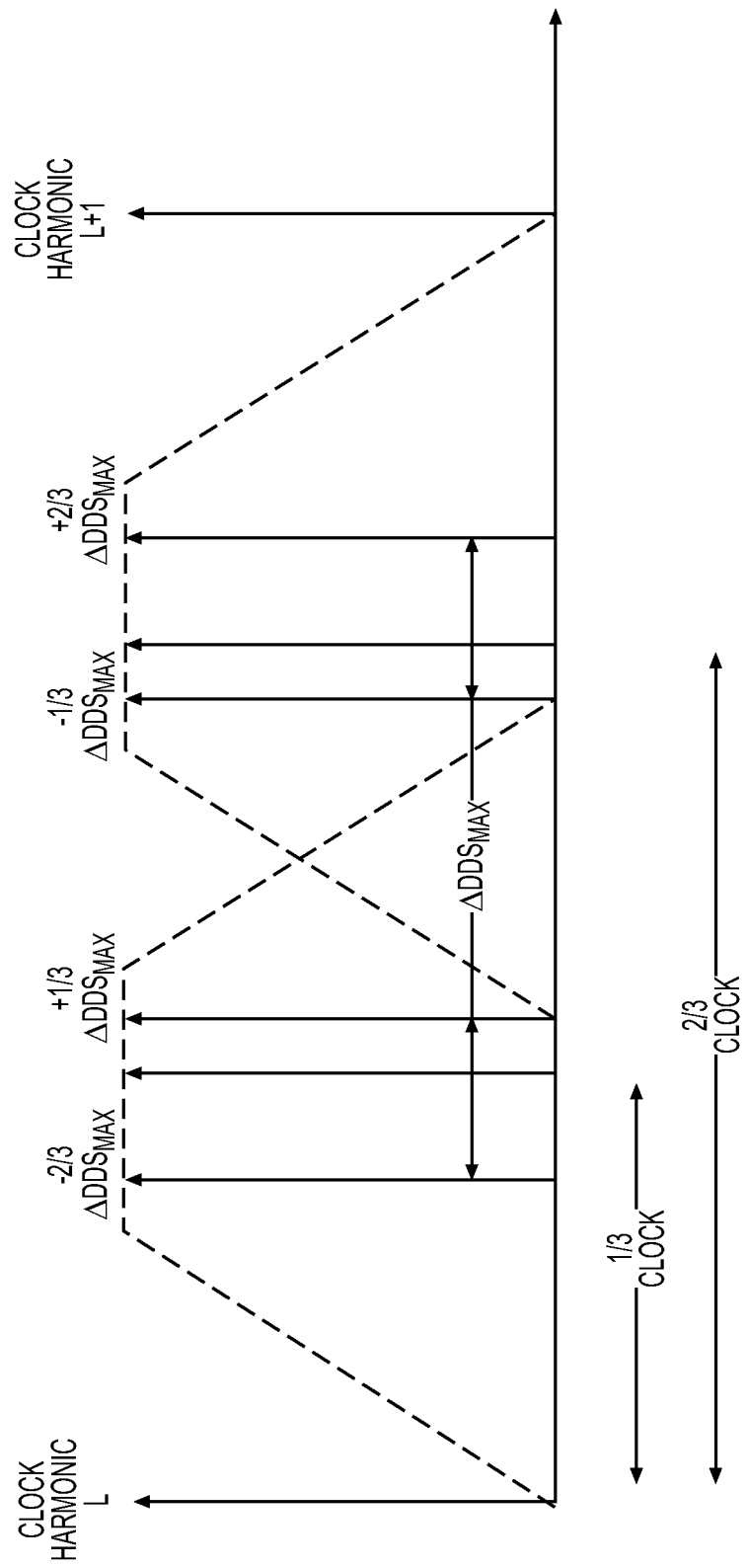
FIG. 6 depicts an example of tuning using the synthesizer of the instant invention.

FIG. 6 depicts an example of tuning using the above equation. Spacing the tuning range as shown in FIG. 5 allows for symmetrical filters with the left and right tuning as aliases of each other. Tuning the synthesizer is accomplished as follows. For a particular synthesizer frequency $F_{LO}$ determine the comb line number, N, from:

$$N = \text{Integer}[(F_{LO} \pm IF)/(\text{Nominal Comb Spacing})]$$

Where, using the exemplary figures used herein, IF is the fixed 125 MHz frequency and the nominal comb spacing is 468.75 MHz. The DDS frequency can be found from:

$$\Delta F_{DDS} = \frac{F_{LO} \pm IF}{N} - (\text{Nominal Comb Spacing})$$

The signs account for the polarity of the PLL, which can either be fixed or switched. The sign of the error correction signal from the PLL depends on the phase relationship between the IF and the reference signals. A polarity switch reverses the role of IF and reference signal internal to the PLL thus reversing the polarity of the error correction signal. If the PLL is fixed polarity then care must be taken to design for the proper polarity. In the embodiment depicted in FIG. 3, the PLL preferably has a polarity switch which allows for greater flexibility. With the exemplary figures used herein, the nominal DDS frequency is 93.75 MHz.

Figure 7:
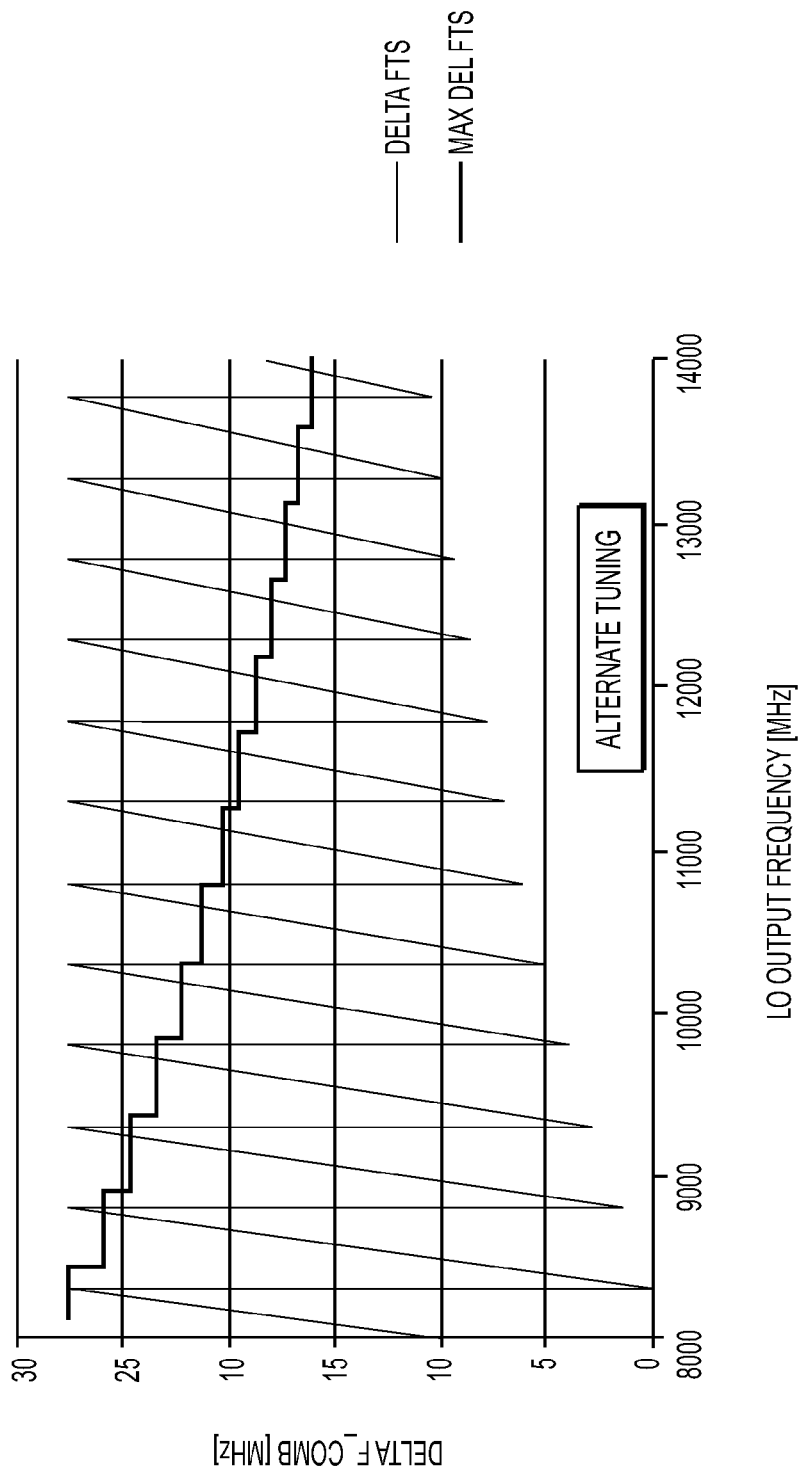
FIG. 7 depicts an example of an alternate tuning using the synthesizer of the instant invention.

FIG. 7 depicts an alternate tuning solution compared to the solution depicted in FIG. 5. If the PLL has a polarity switch there are alternative tunings with an IF frequency of −125 MHz. The additional tunings are helpful with spur mitigation. The alternate tuning shown in FIG. 7 allows some flexibility for continuous tuning ranges off of the same comb line. There are four possible tuning for many of the desired synthesizer frequencies.

Synthesizer 300 allows for the continuous tuning range to the same comb line multiple of 468.75 MHz versus the maximum continuous tuning range of synthesizer 100 of 22.5 MHz, a factor of about 21 improvement. The improvement provides flexibility especially when using an LO offsetting for suppression of spurious responses.

Due to the digital nature of DDS devices, the devices can produce tones with quantized frequencies, $$v = a\frac{f}{2^b} \quad (1)$$

for DDS clock frequency f, phase register length b bits and integer frequency tuning word value $a \in [0, 2^b-1]$.

In cases where a value of a corresponds exactly to the value of v that is required, the DDS output is as desired. In other cases there will be some approximation. An approximation using frequency toggling (switching between two frequencies that can be attained with the DDS) is described herein. The toggling allows an approximation that accumulates no net long term phase drift and has low power in undesired frequencies (i.e. spurs). It has been shown that all frequencies of the synthesizer can be expressed as $$v = \frac{n}{m}\Delta \quad (2)$$

for integers n and m and where $\Delta$ is defined to be the synthesizer to tuning step size. While it is advisable that the DDS clock frequency f be an integer multiple of $\Delta$, it is not required. However, f and $\Delta$ should be rationally related.

In the preferred embodiment, a two-frequency toggling scheme is parameterized by four integer values: $a_1$ and $a_2$ are tuning words and $k_1$ and $k_2$ are the tuning intervals (measured in DDS clock cycles, 1/f) that the DDS spends using tuning words $a_1$ and $a_2$, respectively. The choice of these four parameters is dictated by the following conditions:

1. Over $k_1+k_2$ DDS cock cycles the DDS preferably gains no phase relative to an ideal oscillator of frequency v:

$$k_1 a_1 \frac{f}{2^b} + k_2 a_2 \frac{f}{2^b} = (k_1 + k_2)v \quad (3)$$

2. To minimize phase excursion, the period $k_1+k_2$ is preferably minimized.
3. To minimize phase excursion during the $k_1+k_2$ DDS clock cycles, the values of $a_1$ and $a_2$ are preferably as similar as possible.

The goal to minimize the difference in tuning words in order to minimize phase excursion suggests that two frequency words should be:

$$a_1 = \left\lceil \frac{2^b v}{f} \right\rceil \text{ and} \quad (4)$$

$$a_2 = \left\lfloor \frac{2^b v}{f} \right\rfloor, \quad (5)$$

or, in other words, the two integers that bracket the generally-non-integral value $2^b v/f$. This value leads to $a_1-a_2=1$, the smallest difference possible.

Equation (3) can be solved subject to the tuning word ansatz. Equation (3) can be rewritten as:

$$mf(k_1 a_1 + k_2 a_2) = (2^b n\Delta)(k_1 + k_2) \quad (6)$$

If:

$$g = gcd(mf, 2^b n\Delta) \quad (7)$$

where gcd is the greatest common divisor, then mf/g and $2^b n\Delta/g$ are both integers and are relatively prime. The constraints for $k_1$ and $k_2$ can then be written as:

$$\left(\frac{mf}{g}\right)(k_1 a_1 + k_2 a_2) = \left(\frac{2^b n\Delta}{g}\right)(k_1 + k_2) \quad (8)$$

Equation (8) is satisfied if the following pair of equations simultaneously hold:

$$k_1 + k_2 = \frac{mf}{g} \quad (9)$$

$$k_1 a_1 + k_2 a_2 = \frac{2^b n\Delta}{g} \quad (10)$$

Solving the two equations for the unknowns ($k_1$ and $k_2$) and making use of $a_1-a_2=1$ yields:

$$k_1 = \frac{mf}{g} a_2 - \frac{2^b n\Delta}{g} \quad (11)$$

$$k_2 = \frac{2^b n\Delta}{g} - \frac{mf}{g} a_2 \quad (12)$$

Both equations (11) and (12) are integral and greater or equal to 0 (as a negative solution to either would be unphysical). The values of $a_1$ and $a_2$ given by equations (4) and (5) lead to:

$$k_1 = \frac{mf}{g}\left\lfloor \frac{2^b v}{f} \right\rfloor - \frac{2^b n\Delta}{g} \quad (13)$$

$$k_1 \geq \frac{mf}{g}\frac{2^b n\Delta}{mf} - \frac{2^b n\Delta}{g} \quad (14)$$

$$k_1 \geq 0 \quad (15)$$

and $$k_2 = \frac{2^b n\Delta}{g} - \frac{mf}{g}\left\lfloor \frac{2^b v}{f} \right\rfloor \quad (16)$$

$$k_2 \geq \frac{2^b n\Delta}{g} - \frac{mf}{g}\frac{2^b n\Delta}{mf} \quad (17)$$

$$k_1 \geq 0 \quad (18)$$

Figure 8:
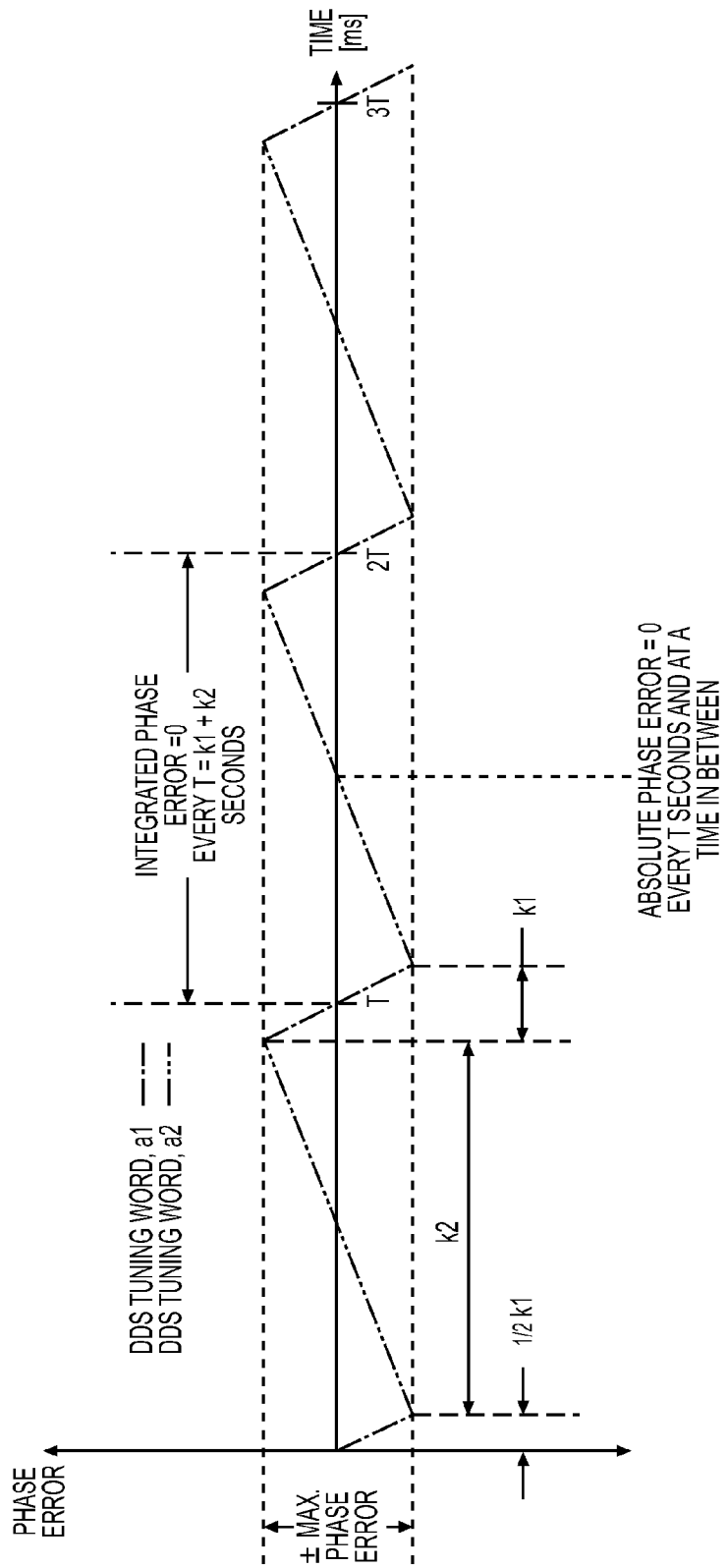
FIG. 8 depicts a schematic of an embodiment of the toggling process.

Note that the values of $k_1$ and $k_2$ can be simultaneously scaled by the same integer without breaking equation (3) questioning the optimality of the solutions. The relative primality of mf/g and $2^b n\Delta/g$ guarantee that the $k_1+k_2$ determined using the equations herein yields the minimum possible value. FIG. 8 depicts a schematic depiction of the toggling process. In the figure, it is assumed that $k_1$ is the even term. Either $k_1$ or $k_2$ will be even, but not both.

In the modified DDS design, the deviation from the ideal output signal can be thought of as a phase modulation:

$$F(t) = V \sin 2\pi(vt + \epsilon(t)) \quad (19)$$

where V is the peak voltage of the synthesizer output and $\epsilon(t)$ is a piecewise linear function specifying the number of turns of phase error that alternately grows and shrinks in magnitude such that over time no average phase drift is accumulated. No average phase offset ($\overline{\epsilon(t)}=0$) can be achieved by starting the switching cycle half-way through the designated interval for frequency $f_1$. Because $\epsilon \ll 1$, equation (19) can be expanded as:

$$F(t) = F_0(t) + F_H(t) = V \sin 2\pi vt + V\epsilon(t) \cos 2\pi vt + O(\epsilon^2) \quad (20)$$

The first term is the desired synthesizer waveform and the second term is the cause of the unwanted harmonics. The relative power in harmonics to power in the desired tone can be calculated as follows:

$$P_H = \overline{F_H^2(t)}/Z \quad (21)$$

$$P_0 = \overline{F_0^2(t)}/Z \quad (22)$$

where Z is the impedance being driven by the synthesizer. This leads to:

$$\frac{P_H}{P_0} = (2\pi)^2 \overline{\epsilon^2(t)} \quad (23)$$

Since $\epsilon(t)$ is piecewise linear and always increases to magnitude $\epsilon_{max}$ before returning to zero, $\overline{\epsilon^2(t)} = \epsilon_{max}^2/3$, so:

$$\frac{P_H}{P_0} = \frac{(2\pi)^2}{3} \epsilon_{max}^2 \quad (24)$$

An extension of the toggling approach begins the sequence at zero phase but halfway through the duration of one of the frequency settings can be used to generate a signal with zero mean phase offset.

If the full sequence is long and leads to higher than acceptable spur power, the sequence can be broken down into additional stages. For example, if the sequence as prescribed herein were $k_1$ and $k_2$ clock cycles with tuning words $a_1$ and $a_2$ respectively, shorter tuning periods alternating between $a_1$ and $a_2$ of $k_j$ can be used instead as long as $\Sigma_{odd\ j} k_j = k_1$ and $\Sigma_{j\ even} k_j = k_2$. This may be more difficult to implement but minimizes generation of spurious tones by minimizing the maximum error in the DDS phase register.

EXAMPLE

Figure 9:
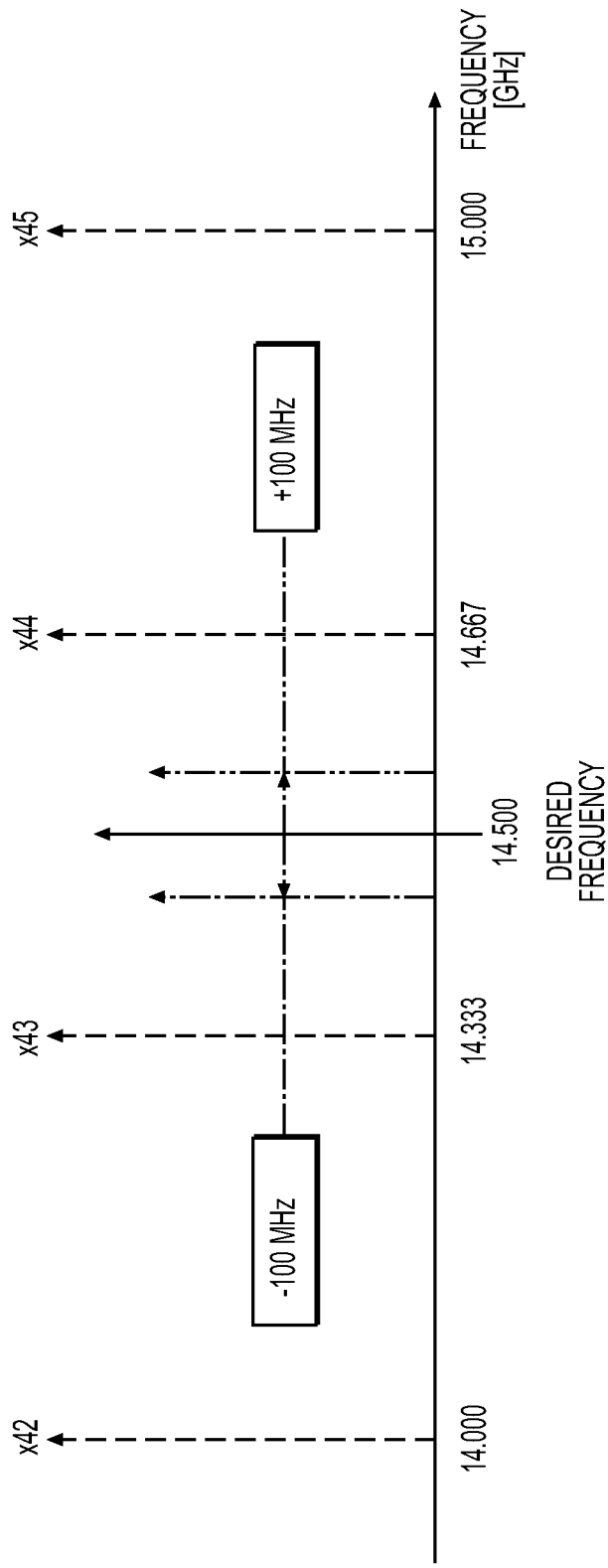
FIG. 9 depicts nominal comb lines in the 14-15 GHz range with a synthesizer output frequency of 14500 MHz.

Using synthesizer 300 with the clock frequency set to 500 MHz, the nominal comb line space at ⅔ of the clock or 333.333 MHz (e.g. at the $2^{nd}$ Nyquist zone), the maximum DDS tuning range set to 35 MHz, FIG. 9 shows the nominal comb lines in the 14-15 GHz range with a desired synthesizer output frequency of 14500 MHz. The comb lines lower than the desired frequency are successively move up to either ±100 MHz from the desired output frequency by adjusting upward the DDS frequency (like an accordion).

In the example, the closest comb line on the low side is times 43 and the desired output frequency can be phased locked to comb lines as low as the nominal clock frequency time 40 without violation the maximum tuning range of the DDS (see Table 1). The tuning is determined by calculating the difference between the desired comb to lock to and the desired IF (high or low) and dividing by the comb line harmonic number. 14400 MHz minus 14333.3 divided by 43 is the tuning step beyond the nominal comb frequency. Table 1 shows the total available tuning for this frequency which may be chosen to optimize phase noise or reduce/eliminate spurious responses (originating mostly from the mixer and the DDS).

TABLE 1

Bold values violate previous design constraints.

| IF Side [MHz] | Harmonic # | Tuning [MHz] | DDS Output [MHz] |
|---|---|---|---|
| −100 | 43 | 1.550 | 334.884 |
| 100 | 43 | 6.202 | 339.535 |
| −100 | 42 | 9.524 | 342.857 |
| 100 | 42 | 14.286 | 347.619 |
| −100 | 41 | 17.886 | 351.220 |
| 100 | 41 | 22.764 | 356.098 |
| −100 | 40 | 26.667 | 360.000 |
| 100 | 40 | 31.667 | 365.000 |
| −100 | 39 | 35.897 | 369.231 |
| 100 | 39 | 41.026 | 374.359 |

The DDS can work beyond the first Nyquist zone. The DDS generates spurious responses especially when set to rational values of the clock (e.g. ⅔ or ¾). At higher frequencies, the multiple tuning solutions provide flexibility.

Table 2 displays representative values for a synthesizer set to 500 MHz and a phase register length of 32 bits.

TABLE 2

Magnitudes of values

| V (Hz) | $a_1$ | $a_2$ | $k_1$ | $k_2$ | $\epsilon_{max}$ (turns) | $P_H/P_0$ (dB) |
|---|---|---|---|---|---|---|
| 20 × 10000 | 1717986 | 1717987 | 51 | 574 | 5.5 × 10−9 | −154 |
| 500/22 × 10000 | 1952257 | 1952258 | 38 | 237 | 3.8 × 10−9 | −157 |
| 500/23 × 10000 | 1867377 | 1867378 | 526 | 49 | 5.2 × 10−9 | −154 |
| 623/23 × 10000 | 2326751 | 2326752 | 10912 | 60963 | 1.1 × 10−6 | −108 |
| 361/17 × 10000 | 1824097 | 1824098 | 6634 | 46491 | 6.8 × 10−7 | −112 |
| 362/17 × 10000 | 1829150 | 1829151 | 11803 | 41322 | 1.1 × 10−6 | −108 |
| 6250/32 × 10000 | 16777216 | 16777217 | 1 | 0 | 0 | −∞ |
| 10999/22 × 10000 | 42945768 | 42945769 | 19103 | 15272 | 9.9 × 10−7 | −109 |

Note that in the case of v=6250/32×10000 Hz, a tuning word of 16777216 exactly produces the desired output frequency, so toggling is not required. In the example, the maximum phase error, $\epsilon_{max}$, can be computed as follows: the greatest deviation from the correct frequency occurs when $2^b v/f$ is half-integral and where the value of $k_1+k_2$ (given in equation (9)) is maximal. The maximal value happens at the largest value of m (in this case 47) and for the lowest value of g (in this case 160000) reachable. In this worst case scenario, $k_1=k_2=734375$. The worst case phase excursion reached is, thus, $\epsilon_{max}=8.5\times10^{-6}$ for an ideal unit that can switch phases at arbitrary time steps.

The examples herein are based on an exemplary synthesizer having a particular design for the sake of clarity (the synthesizer was designed to operate over the 2-16 GHz range with a 500 MHz clock and fixed 100 MHz IF). However, the concepts are applicable over a wide range of designs and the methods apply generally.

Figure 10:
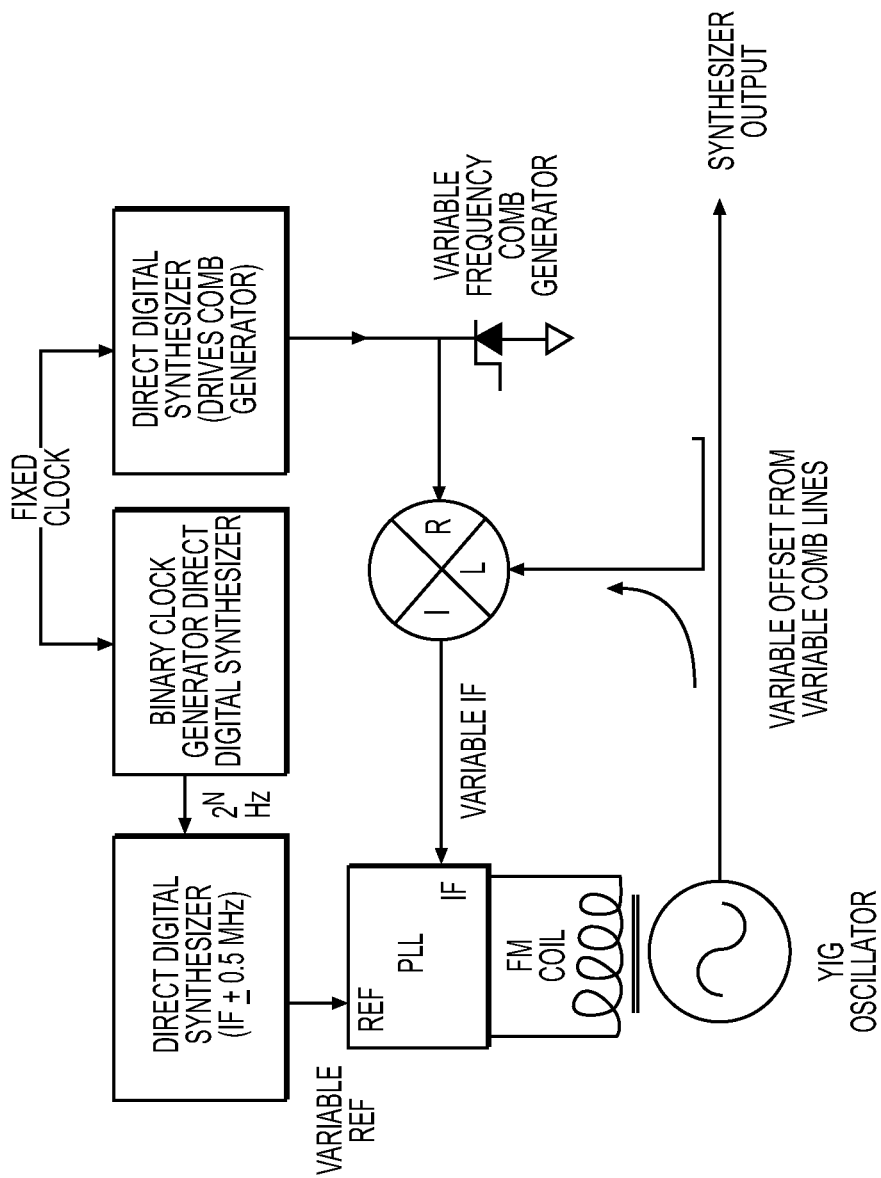
FIG. 10 depicts another embodiment of the invention wherein both the comb generator drive signal and the IF variable.

In another Example, as depicted in FIG. 10, if it is desired to have a small step size (e.g. 1 Hz or sub-hertz) problems arise via the toggling sequence length, which can become excessively long. This in turn increases the spurs generated by the toggling sequence. In fact, typically, the longer the sequence, the higher these spurs becomes. However, if the first part of the synthesizer is restricted to, for example, 1 MHz step sizes, then the sequence lengths can be shorter.

If there is a desire to make the step sizes even smaller than the 1 MHz, a second DDS can be added that creates a reference signal for the PLL. Furthermore, if the IF is allowed to vary over ±1 MHz the step can be a desired size. The second DDS would preferably also employ toggling. The resolution of the step size may be subject only to the limit placed on the toggle sequence length of the DDS generating the PLL Reference (and the associated toggle spurs).

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. It is intended that the specification and examples be considered exemplary only with the true scope and spirit of the invention indicated by the following claims. Furthermore, the term "comprising of" includes the terms "consisting of" and "consisting essentially of."

The invention claimed is:

1. A variable frequency synthesizer, comprising:
   a reference frequency;
   a direct digital synthesizer (DDS) receiving the reference frequency and outputting a tuned frequency;
   a variable frequency comb generator receiving the tuned frequency and outputting a variable frequency comb comprised of a plurality of comb lines; and
   a tunable filter adapted to tune the variable frequency synthesizer to a specific comb line from the plurality of comb lines;
   wherein the variable frequency synthesizer outputs a range of synthesized frequencies based on the specific comb line the variable frequency synthesizer is tuned to.

2. The synthesizer of claim 1, wherein the reference frequency is fixed.

3. The synthesizer of claim 1, wherein the reference frequency is variable.

4. The synthesizer of claim 1, further comprising a second fixed reference frequency, wherein the DDS receives the second fixed reference frequency.

5. The synthesizer of claim 1, wherein there are no tuning holes in the outputted synthesized frequency range.

6. The synthesizer of claim 1, wherein the DDS is tunable over a range of about ⅙ of the reference frequency to about ⅖ of the reference frequency.

7. The synthesizer of claim 6, wherein the DDS output frequency is within a first Nyquist zone.

8. The synthesizer of claim 6, wherein the DDS output frequency is in a Nyquist zone higher than the first Nyquist zone.

9. The synthesizer of claim 1, wherein the relationship between the lowest outputted synthesized frequency ($F_{MIN}$), the maximum DDS tuning range ($\Delta DDS_{MAX}$), and the nominal comb line spacing is governed by:

$$F_{MIN} \times \Delta DDS_{MAX} \geq (\text{comb spacing})^2.$$

10. The synthesizer of claim 1, wherein the frequency comb lines cover a range of 2 to 20 GHz.

11. The synthesizer of claim 1, wherein the DDS is toggled to tune the synthesizer to a desired frequency not otherwise attainable by the DDS absent toggling.

12. The synthesizer of claim 11, wherein the specific frequency is attained by switching between a first frequency attainable by the DDS without toggling and a second frequency attainable by the DDS without toggling, wherein the first frequency and the second frequency surround the desired frequency.

13. The synthesizer of claim 12, wherein the DDS is held at a first tuning word for a first sequence length and subsequently held at a second tuning word for a second sequence length.

14. The synthesizer of claim 13, wherein the first tuning word and the second tuning word differ by one and the total time of the first sequence length and the second sequence length is minimized.

15. The synthesizer of claim 14, wherein the first tuning word is determined by $$a_1 = \lfloor 2^b v/f \rfloor;$$

the second tuning word is determined by $$a_2 = \left\lceil \frac{2^b v}{f} \right\rceil;$$

the first sequence length is determined by $$k_1 = \frac{mf}{g} a_2 - \frac{2^b n \Delta}{g};$$

and
the second sequence length is determined by $$k_2 = \frac{2^b n \Delta}{g} - \frac{mf}{g} a_1;$$

wherein, f is the clock frequency, b is the phase register length, v is a frequency related to f by a ratio of integers, m and n are integers, $\Delta$ is the synthesizer tuning step size, and $g=\gcd(mf, 2^b n\Delta)$, wherein gcd is the greatest common divisor.

16. The synthesizer of claim 12, wherein the DDS is varies between a first tuning word and a second tuning word for a first sequence length and subsequently the DDS is held at a second tuning word for a second sequence length.

17. A method of outputting a variable frequency, comprising:
   outputting a reference frequency at a clock;
   receiving the reference frequency at a direct digital synthesizer (DDS);
   outputting a tuned frequency from the DDS;

receiving the tuned frequency at a variable frequency comb generator;

outputting a variable frequency comb comprised of a plurality of comb lines from the variable frequency comb generator;

receiving the variable frequency comb at a tunable filter;

tuning to a specific comb line of the plurality of comb lines; and outputting a range of synthesized frequencies based on the specific comb line.

18. The method of claim 17, wherein the reference frequency is fixed.

19. The method of claim 17, wherein the reference frequency is variable.

20. The method of claim 17, wherein the DDS receives a second reference frequency.

21. The method of claim 17, wherein there are no tuning holes in the outputted synthesized frequency range.

22. The method of claim 17, wherein the DDS is tunable over a range of about 1/6 of the fixed reference frequency to about 2/5 of the reference frequency.

23. The method of claim 22, wherein the DDS output frequency is within the first Nyquist zone.

24. The method of claim 22, wherein the DDS output frequency is in a Nyquist zone higher than the first Nyquist zone.

25. The method of claim 1, wherein the relationship between a lowest outputted synthesized frequency ($F_{MIN}$), a maximum DDS tuning range ($\Delta DDS_{MAX}$), and comb line spacing is governed by:

$$F_{MIN} \times \Delta DDS_{MAX} \geq (\text{comb spacing})^2.$$

26. The method of claim 17, wherein the frequency comb lines cover a range of 2 to 18 GHz.

27. The method of claim 17, wherein the DDS is toggled to tune the synthesizer to a desired frequency not otherwise attainable by the DDS absent toggling.

28. The method of claim 27, wherein the specific frequency is attained by tuning between a first frequency attainable by the DDS without toggling and a second frequency attainable by the DDS without toggling, wherein the first frequency and the second frequency surround the desired frequency.

29. The method of claim 28, wherein the DDS is held at a first tuning word for a first sequence length and subsequently held at a second tuning word for a second sequence length.

30. The method of claim 29, wherein the first tuning word and the second tuning word differ by one and the total time of the first sequence length and the second sequence length is minimized.

31. The method of claim 30, wherein the first tuning word is determined by $$a_1 = \left\lfloor \frac{2^b v}{f} \right\rfloor;$$

the second tuning word is determined by $$a_2 = \left\lceil \frac{2^b v}{f} \right\rceil;$$

the first sequence length is determined by $$k_1 = \frac{mf}{g} a_2 - \frac{2^b n \Delta}{g};$$

and the second sequence length is determined by $$k_2 = \frac{2^b n \Delta}{g} - \frac{mf}{g} a_1;$$

wherein, f is the clock frequency, b is the phase register length, v is a quantized frequency, m and n are integers, $\Delta$ is the synthesizer tuning step size, and g=gcd(mf, $2^b n \Delta$), wherein gcd is the greatest common divisor.

32. The method of claim 27, wherein the DDS is varies between a first tuning word and a second tuning word for a first sequence length and subsequently the DDS is held at a second tuning word for a second sequence length.

* * * * *